United States Patent
Hosono

(10) Patent No.: US 7,562,266 B2
(45) Date of Patent: Jul. 14, 2009

(54) METHOD AND DEVICE FOR VERIFYING TIMING IN A SEMICONDUCTOR INTEGRATED CIRCUIT

(75) Inventor: Toshikatsu Hosono, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 28 days.

(21) Appl. No.: 11/389,008

(22) Filed: Mar. 27, 2006

(65) Prior Publication Data

US 2007/0113132 A1    May 17, 2007

(30) Foreign Application Priority Data

Nov. 16, 2005    (JP)    ............... 2005-331792

(51) Int. Cl.
G11B 20/20    (2006.01)
G01R 31/28    (2006.01)

(52) U.S. Cl. ...................... 714/700; 714/731
(58) Field of Classification Search ............... 714/700
See application file for complete search history.

(56) References Cited

U.S. PATENT DOCUMENTS

| | | | | |
|---|---|---|---|---|
| 5,239,481 | A * | 8/1993 | Brooks et al. .................. 716/6 |
| 6,629,289 | B2 * | 9/2003 | Yamamoto et al. .......... 714/815 |
| 6,990,417 | B2 * | 1/2006 | Yamaguchi et al. ........... 702/69 |
| 7,119,570 | B1 * | 10/2006 | Chirania et al. ............. 324/765 |
| 7,120,838 | B2 * | 10/2006 | Casper et al. ................ 714/700 |
| 7,225,370 | B2 * | 5/2007 | Chow et al. .................. 714/700 |
| 7,239,997 | B2 | 7/2007 | Yonezawa |
| 2001/0005898 | A1 | 6/2001 | Yamamoto et al. |
| 2004/0167756 | A1 | 8/2004 | Yonezawa |

FOREIGN PATENT DOCUMENTS

| | | |
|---|---|---|
| JP | 6-76015 | 3/1994 |
| JP | 2000-195960 | 7/2000 |
| JP | 2001-184372 | 7/2001 |
| JP | 2004-252831 | 9/2004 |

OTHER PUBLICATIONS

Japanese Patent Office Action, Dated Mar. 10, 2009.

* cited by examiner

*Primary Examiner*—James C Kerveros
(74) *Attorney, Agent, or Firm*—Staas & Halsey LLP

(57) ABSTRACT

A timing verification device for performing effective timing verification while correctly taking variation into account. The timing verification device receives a technology file and extracts a coefficient of variation for each cell based on conditions of the manufacturing process of a semiconductor integrated circuit. The timing verification device receives a timing list and computes the variation amounts corresponding to the rise and fall of a clock signal or a correction coefficient obtained by taking into account the correlation between the rise and the fall based on the extracted coefficients of variation. The timing verification device re-computes a delay time using the amount of variation or the correction coefficient and determines the pulse width and the timing based on the recomputed delay time to output the determination result as a timing report.

12 Claims, 14 Drawing Sheets

Fig.7

| PTV Condition | H Pulse | Transistor Process Variation | Power Supply Voltage | Temperature | Wiring | Computation Error |
|---|---|---|---|---|---|---|
| Worst | Rise (start) | +Random | Min | Max | Max Xtalk included | +Random |
|  | Fall (end) | -Random | Min+wv | Max-wt | Maxmin Xtalk included | -Random |
| Best | Rise (start) | +Random | Max-bv | Min+bt | Minmax Xtalk included | +Random |
|  | Fall (end) | -Random | Max | Min | Min Xtalk included | -Random |

|  | rise_slow | rise_fast |
|---|---|---|
| fall_slow | (1.2:1.2) | (0.9:1.1) |
| fall_fast | (1.1:0.9) | (0.8:0.8) |

~61

METHOD AND DEVICE FOR VERIFYING TIMING IN A SEMICONDUCTOR INTEGRATED CIRCUIT

CROSS-REFERENCE TO RELATED APPLICATIONS

This application is based upon and claims the benefit of priority from the prior Japanese Patent Application No. 2005-331792, filed on Nov. 16, 2005, the entire contents of which are incorporated herein by reference.

BACKGROUND OF THE INVENTION

The present invention relates to a method and device for verifying timing in a semiconductor integrated circuit.

In the prior art, timing verification for a digital circuit is performed by conducting, for example, static timing analysis (STA). The static timing analysis checks and ensures operation of a logic circuit by verifying timings for the circuit based on delay times assigned to respective elements in the circuit. As shown in FIG. 1, the timing verification includes a delay computation step (step 201) and a timing analysis step (STA) (step 202). In the delay computation, a processor retrieves parasitic information such as wiring parasitic capacitance from a file 203, a cell library from a file 204, and setup information such as correction information for delay computation results from a file 205. The processor then computes delay values for the respective elements of the logic circuit to generate a file 206 containing delay information. In the timing analysis, the processor performs the static timing analysis by computing an accumulated delay value in a path (signal transfer path) based on the delay information stored in the file 206 (i.e., the delay values computed in step 201) and design constraints stored in a file 207 to analyze the pulse width at an input terminal of a circuit such as a flip-flop circuit (FF circuit) or a memory. The processor then generates a result for the timing verification (timing report 208) of the logic circuit based on the result for the static timing analysis.

Delay times of elements are affected by variations in the processes performed to form transistor wiring on a semiconductor integrated circuit or variations in factors such as a power supply voltage and temperature. Therefore, in the step for computing delay values, the processor takes into account the coefficient of variation (OCV) for each element in the chip to compute the delay values. The static timing analysis, which uses the delay values computed in this manner, verifies whether or not the semiconductor integrated circuit functions normally even if there are variations between elements in the chip.

For example, referring to FIG. 2, a semiconductor integrated circuit includes an FF circuit 212 receiving a clock ck via a plurality of buffer circuits 211. Pulse width check is performed by checking the pulse width of the clock ck at a clock input terminal 212a of the FF circuit 212. The clock ck is delayed by the path delay caused by the plurality of buffer circuits 211 and reaches the FF circuit 212 as a clock ck1. The pulse width Width(H) of this clock ck1 is obtained by the following equation (1), which is based on a pulse width pw(H) of the clock ck and a rise delay time "rise_maxmax" and a fall delay time "fall_maxmin" of the clock ck1 at the input terminal of the buffer circuit 211 with respect to a supply source (e.g., an external input terminal) of the clock ck:

$$\text{Width}(H) = PW(H) + \text{fall\_maxmin} - \text{rise\_maxmax} \quad (1)$$

The rise delay time "rise_maxmax" is the delay time of the rising edge (rise delay) of the clock ck1 with respect to the rising edge of the clock ck under the worst conditions. The fall delay time "fall_maxmin" is the delay time of the falling edge (fall delay) of the clock ck1 with respect to the falling edge of the clock ck under the worst conditions.

The maximum value of the delay time is taken into account for the rise delay time "rise_maxmax" and the minimum value of the delay time is taken into account for the fall delay time "fall_maxmin" so that the variation between the delay times "rise_maxmax" and "fall_maxmin" is maximized to conduct a strict timing check. Japanese Laid-Open Patent Publication No. 2001-184372 describes a method for verifying a pulse width using an equation similar to equation (1).

When using a coefficient of variation OCVw under the worst conditions, the equation (1) is expressed as follows:

$$\text{Width}(H) = PW(H) + \text{fall\_maxmax} \times OCVw - \text{rise\_maxmax} \quad (2)$$

The pulse width Width(H) obtained from equation (2) is compared with a specified value tPW for a subject cell (the FF circuit 212 in FIG. 2) to conduct the pulse width check.

Similarly, an L pulse width Width(L) under the worst conditions is obtained from the following equation:

$$\text{Width}(L) = pw(L) + \text{rise\_maxmin} - \text{fall\_maxmax}$$

$$= pw(L) + \text{rise\_maxmax} \times OCVw - \text{fall\_maxmax}$$

An H pulse width Width(H) under the best conditions is obtained from the following equation:

$$\text{Width}(H) = pw(H) + \text{fall\_minmin} - \text{rise\_minmax}$$

$$= pw(H) + \text{fall\_minmin} - \text{rise\_minmin} \times OCVb$$

An L pulse width Width(L) under the best conditions is obtained from the following equation:

$$\text{Width}(L) = pw(L) + \text{rise\_minmin} - \text{fall\_minmax}$$

$$= pw(L) + \text{rise\_minmin} - \text{fall\_minmin} \times OCVb$$

In the above equations, "minimin" represents the minimum delay under the best conditions, "minmax" represents the maximum delay under the best conditions, and "OCVb" represents a coefficient of variation under the best conditions.

Referring to FIG. 3, in another example, a semiconductor integrated circuit includes two FF circuits 222 and 223 receiving a clock ck via a plurality of buffer circuits 221. The first FF circuit 222 operates in synchronization with the rising edge of a clock ck1 transferred via the buffer circuits 221, and the second FF circuit 223 operates in synchronization with the falling edge of a clock ck2 transferred via the buffer circuits 221. A timing check is conducted to check the timing of data D at an input terminal 223a of the FF circuit 223 and the clock ck2 at an input terminal 223b of the FF circuit 223.

SUMMARY OF THE INVENTION

If the quantity of the buffer circuits 211 transferring the clock ck is increased in the circuit shown in FIG. 2, the amount of variation accumulated in the path from the input terminal of the clock ck to the FF circuit 212 will also be increased. Thus, the rising edge and the falling edge become close to each other and the pulse width of the clock ck1 becomes very small. As a result, the pulse width of the clock ck1 is determined as being an error at input terminals of many circuits. This leads to the need for taking measures to delay the timing and lengthens the time required for designing the semiconductor integrated circuit.

In addition, the pulse width is affected by the rise delay and fall delay of a signal output by each of the cells (the buffer circuits 211 in FIG. 2). In an actual circuit, however, signals seldom uniformly vary in only either one of the rise and the fall in all the circuit elements. In other words, it is seldom that changes occur in only either one of the rise delay and fall delay of a signal output by a cell due to the influence of variations in a chip. In the prior art technique described above, however, verification is performed while taking into account variations in only one of the delays (i.e., by using the rise delay time and fall delay time for different conditions). Therefore, the verification results are not correct. In other words, the verification is not effective.

In the circuit shown in FIG. 3, the clock ck1 provided to the FF circuit 222, which serves as a source in the data path, has a phase opposite to that of the clock ck2 provided to the FF circuit 223, which functions as a target. Thus, the clock ck1 and the clock ck2 have different transitions. This makes it necessary to separately handle the path of the clock ck extending from the supply source (for example, external input terminal) to the FF circuit 222 and the path extending from the supply source to the FF circuit 223. When these paths are separately handled, variation must be taken into account for each of these paths. As a result, variations are excessively taken into account for both the clock ck1 and the clock ck2. Thus, the verification is not effective.

The present invention provides a timing verification method and device that performs effective timing verification.

One aspect of the present invention is a method for verifying timing of a signal provided to an input terminal through a path including one or more instances with a computer. The method includes generating a distribution of variations in the rise of the signal and a distribution of variations in the fall of the signal at each of the instances, propagating the distribution of variations in the rise of the signal and the distribution of variations in the fall of the signal to the input terminal along the path, and verifying the timing of the signal at the input terminal based on the distribution of variations in the rise of the signal and the distribution of variations in the fall of the signal propagated to the input terminal.

A further aspect of the present invention is a device for verifying timing of a signal provided to an input terminal through a path including one or more instances. The device includes a signal propagation unit for generating a distribution of variations in the rise of the signal and a distribution of variations in the fall of the signal in each of the instances to propagate the distribution of variations in the rise and the distribution of variations in the fall of the signal to the input terminal along the path. A verification unit verifies the timing of the signal at the input terminal based on the distribution of variations in the rise and the distribution of variations in the fall of the signal propagated to the input terminal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 7 is a table showing the variation amount of a signal in a path;

DETAILED DESCRIPTION OF THE PREFERRED EMBODIMENTS

A timing verification device 11 according to a preferred embodiment of the present invention will now be described with reference to the accompanying drawings.

Figure 5:
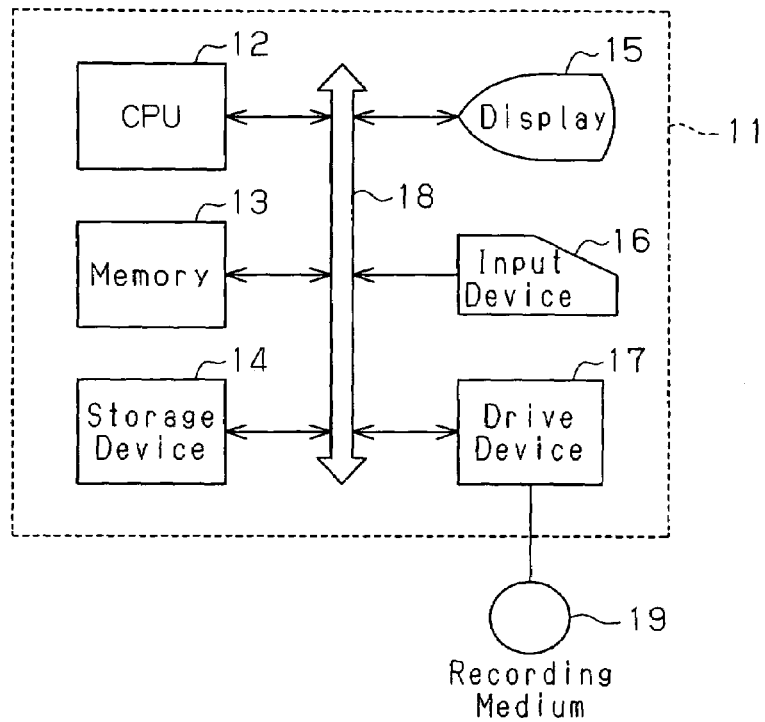
FIG. 5 is a schematic block diagram showing a timing verification device according to a preferred embodiment of the present invention.

FIG. 5 is a schematic block diagram showing the timing verification device 11. The timing verification device 11 may be embodied in a typical computer aided design (CAD) device. The timing verification device 11 includes a central processing unit (CPU) 12, a memory 13, a storage device 14, a display 15, an input device 16, and a drive device 17, which are connected to one another by a bus 18. The CPU 12 functions as a signal propagation unit, a verification unit, and a digitization unit The CPU 12 executes a program by using the memory 13 to perform processing required for timing verification. The memory 13 stores a program and data required for providing the functions for timing verification. Normally, a cache memory, a system memory, or a display memory (not shown) may be used as the memory 13.

The display 15 is used for displaying a layout, a parameter entry screen, or the like. Normally, a CRT, an LCD, or a PDP (not shown) may be used as the display 15. The input device 16 is used by a user to input a request or instruction and parameters. Normally, a keyboard, a mouse and the like (not shown) may be used as the input device 16.

Normally, the storage device 14 may include a magnetic disk device, an optical disc device, a magneto-optical disc device disk device or the like (not shown). The storage device 14 stores program data (hereafter referred to as program) and various data files (hereafter referred to as files) used for performing timing verification processing. In response to an instruction given by a user with the input device 16, the CPU 12 transfers necessary pieces of the data stored in the program or files to the memory 13 for sequential execution. The storage device 14 may also be used as a database.

The program executed by the CPU 12 is provided by a recording medium 19. The drive device 17 drives the recording medium 19 to access the contents recorded in the recording medium 19. The CPU 12 retrieves the program from the recording medium 19 through the drive device 17 and installs the program in the storage device 14.

A memory card, a flexible disk, an optical disc (such as a CD-ROM or DVD-ROM), a magneto-optical disc (such as an MO or MD), or any other computer-readable recording medium (not shown) may be used as the recording medium 19. The program may be stored in the recording medium 19 so that the program is loaded into the memory 13 whenever necessary.

The recording medium 19 may include a medium or a disk device that records a program by uploading or downloading the program with a communication medium. Further, in addition to a recording medium having a recorded program that can be directly executed by a computer, the recording medium 19 may also be a recording medium having a recorded program that can be executed by a computer only after being installed in another recording medium (such as a hard disk) or a recording medium having a recorded program that is encrypted or compressed.

Figure 1:
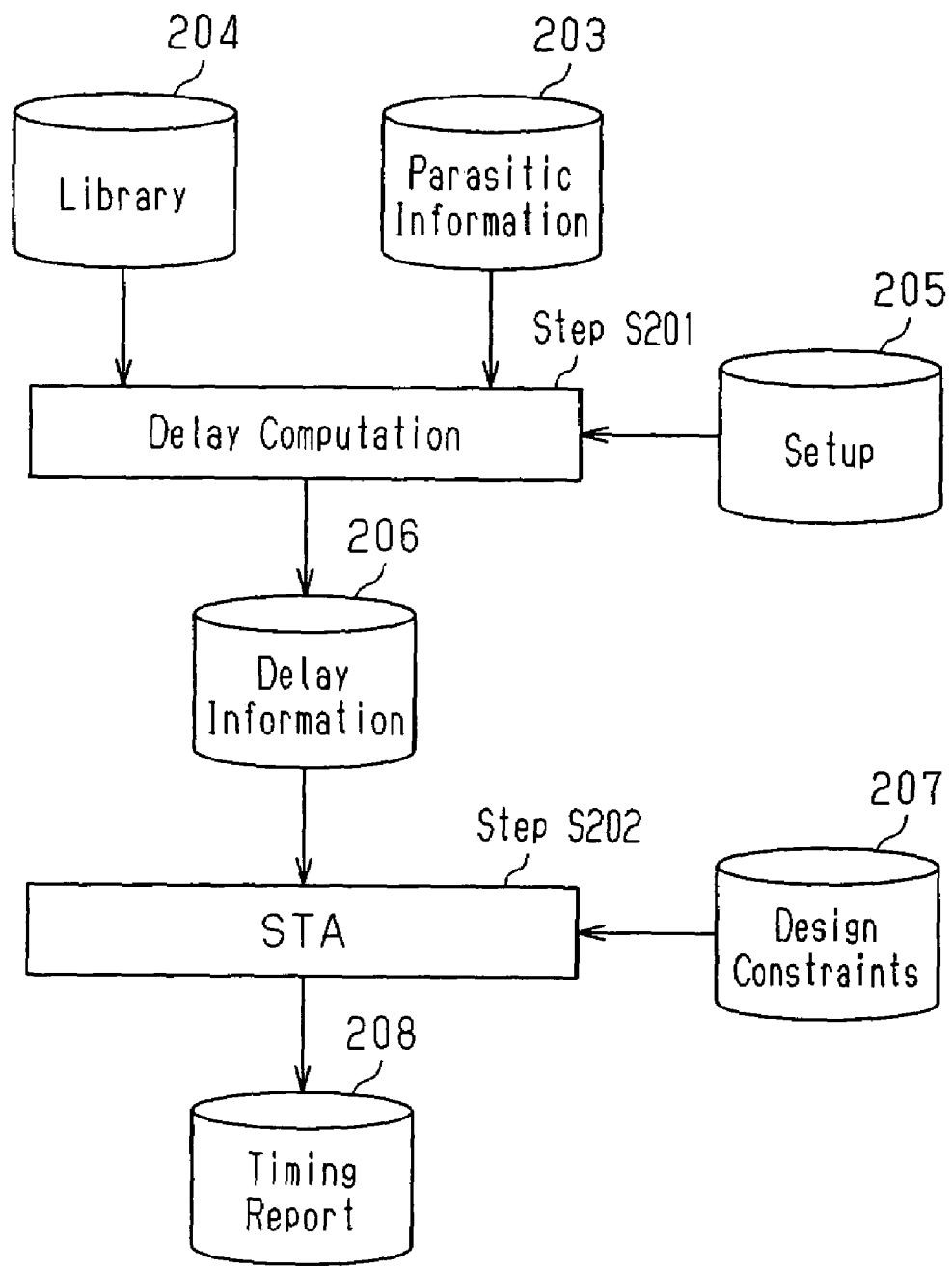
FIG. 1 is a flowchart showing a timing verification process in the prior art.
Figure 2:
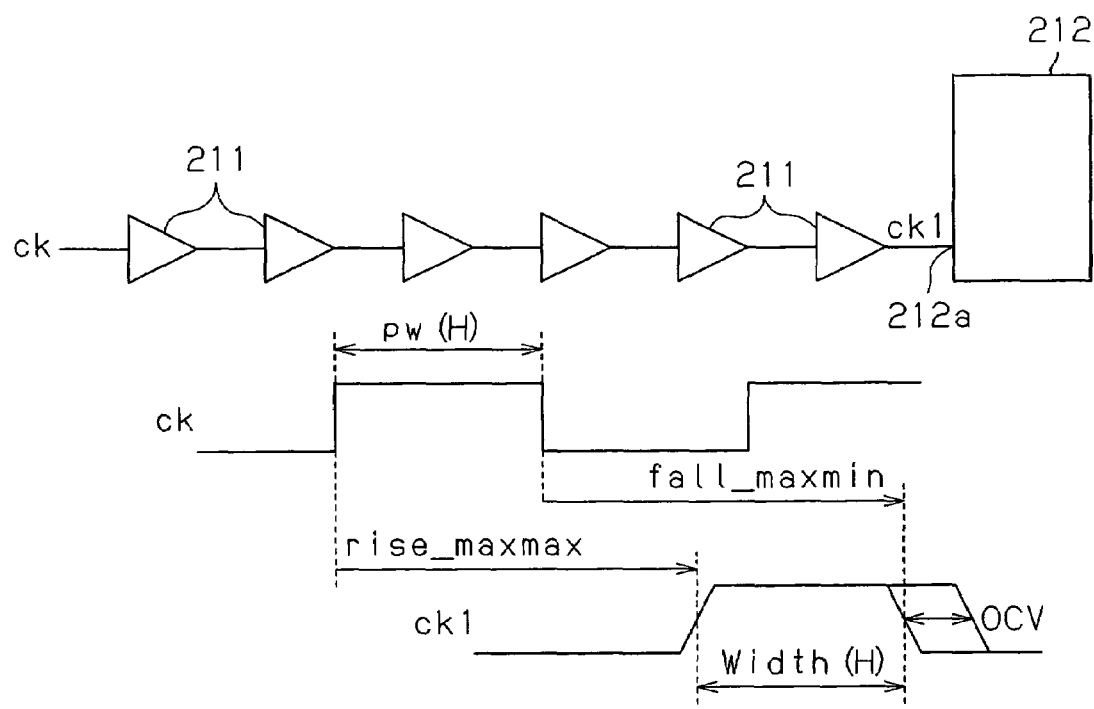
FIG. 2 is a diagram showing pulse width check conducted in the prior art.
Figure 3:
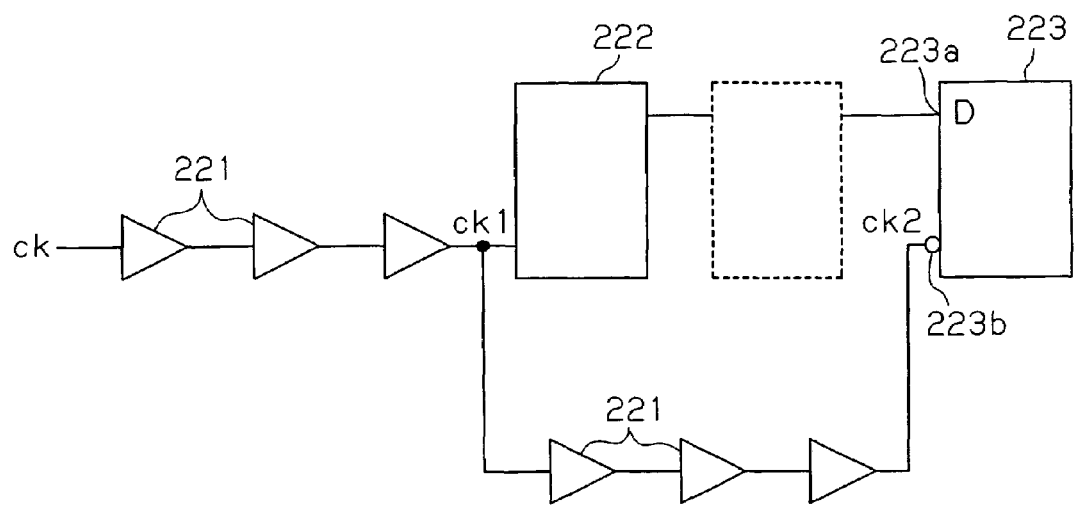
FIG. 3 is a diagram showing a timing check in the prior art.
Figure 3:
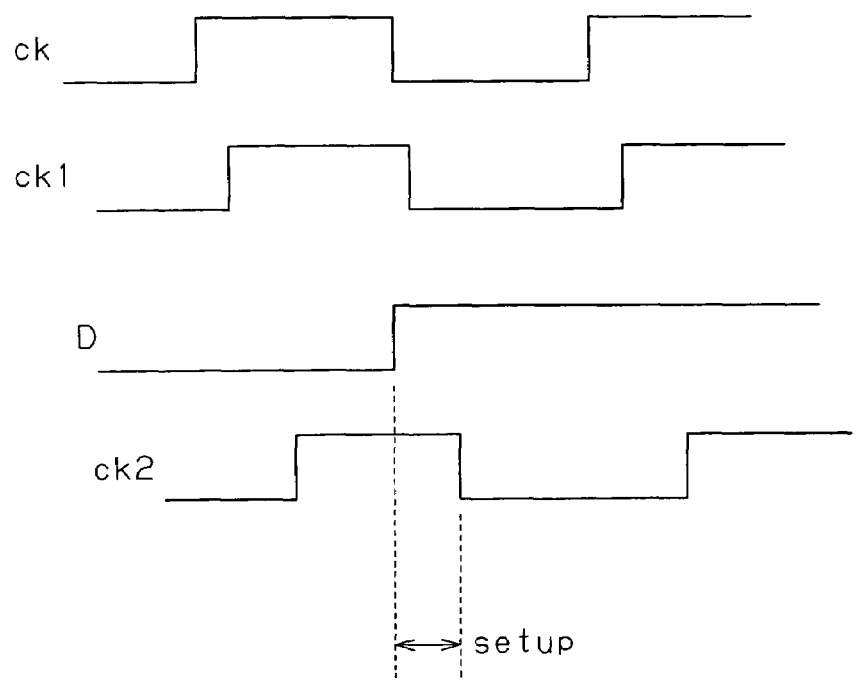
Figure 4:
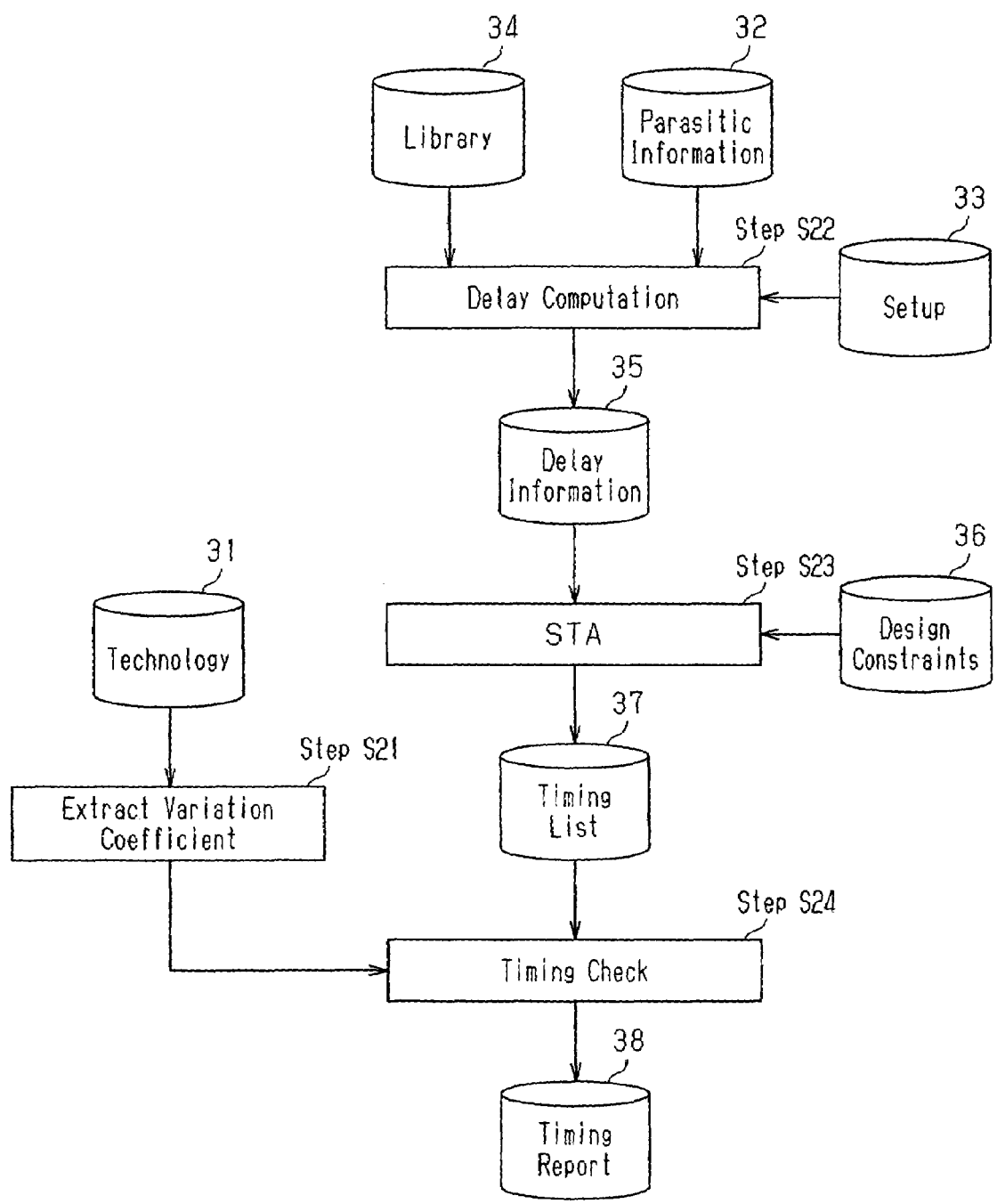
FIG. 4 is a flowchart showing a timing verification process according to a preferred embodiment of the present invention.

FIG. 4 is a flowchart illustrating a timing verification process performed by the timing verification device 11.

The timing verification device 11 receives a technology file 31 in a variation coefficient extraction step (step 21) to extract a coefficient of variation for each cell based on manufacturing process conditions of a semiconductor integrated circuit. The technology file 31 contains a delay time for the rising edge (hereafter, the rising edge is referred to as "rise") of each cell in a typical process and a delay time for the falling edge (hereafter, the falling edge is referred to as "fall"). A value of the rise delay is represented by Tpd_typ_rise, and a value of the fall delay is represented by Tpd_typ_fall. The technology file 31 further contains the value of rise delay Tpd_xx_rise for each cell in modified process conditions and the value of fall delay Tpd_xx_rise. Here, "xx" indicates that the value is based on a result of the delay evaluation. The process conditions include a combination of Pch and Nch which represent types of MOS transistors. In the result of the delay evaluation, the combinations of the rise delay and the fall delay include xx=ss indicating the combination of slow, slow; xx=sf indicating slow and fast; xx=fs indicating fast and slow, and xx=ff indicating fast and fast.

Subsequently, in a delay computation step (step 22), the timing verification device 11 receives parasitic information such as wiring parasitic capacitance from a parasitic information file 32. Further, the timing verification device 11 receives from a setup file 33 correction information (a coefficient of on-chip variation) corresponding to the delay computation result. The timing verification device 11 extracts a delay value (delay information) for each circuit element in the path that is checked, while referring to a cell library 34 based on the parasitic information and the correction information. The timing verification device 11 then generates a file 35 containing the delay information.

In a subsequent timing analysis step (STA) (step 23), the timing verification device 11 receives the delay information from the file 35 and design constraints from a file 36 to perform timing verification based on the delay information and the design constraints. The timing verification device 11 generates a timing list 37 containing the delay information based on the result of the verification.

Then, in a timing check step (step 24), the timing verification device 11 retrieves the timing list 37, and extracts at least either the variation amounts corresponding to rise and fall or the correction coefficients obtained by taking into account the correlation between rise and fall based on the coefficients of variation extracted in step 21. The timing verification device 11 then re-computes a delay time by using at least either the amounts of variation or the correction coefficients that are extracted and determines the pulse width and timing based on the recomputed delay time. The determination result is output as a timing report 38.

Figure 6:
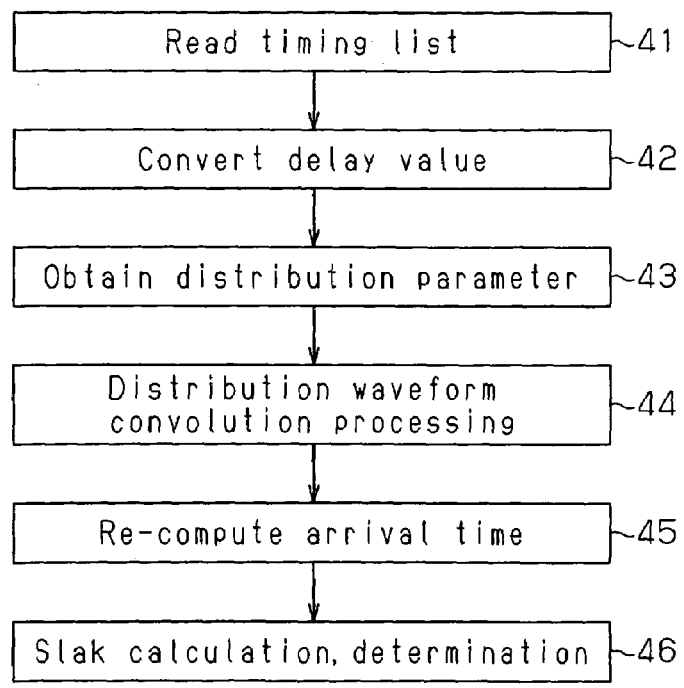
FIG. 6 is a flowchart showing a timing check performed by the timing verification device of FIG. 5.

FIG. 6 is a flowchart illustrating the timing check process. This flowchart illustrates the processing in terms of when the timing verification is performed by extracting the amounts of variation.

In step 41, the timing verification device 11 receives delay information from the timing list 37 shown in FIG. 4. The delay information contains a delay value at a gate (circuit element or cell) in the path, a wiring delay value, and pulse widths (PWIDTH_H, PWIDTH_L) that are set as specifications for the cell to be checked.

In step 42, the timing verification device 11 converts the delay values. The gate delay value in the timing list 37 includes correction information for the delay computation result (coefficient of on-chip variation (OCV coefficient)). Therefore, the timing verification device 11 divides the gate delay value by an OCV coefficient to obtain a median value. Specifically, the timing verification device 11 obtains the median value by dividing the gate delay value of Start_Arrival_Time, at which the front edge of the pulse to be verified arrives at the input terminal of the cell that is to be checked, by the maximum value of on-chip variation OCVmax, and dividing the gate delay value of End_Arrival_Time, at which the rear edge of the pulse arrives, by the minimum value of on-chip variation OCVmin. End_Arrival_Time and Start_Arrival_Time indicate the time required for a signal to be transferred from the start point of the path (i.e., the input point of the signal) to the terminal that is to be checked (delay time).

In step 43, the timing verification device 11 receives coefficients of variation corresponding to rise and fall for each type of the cells and obtains a distribution parameter of variations at the gates (i.e., the range of variation amounts).

In step 44, the timing verification device 11 performs distribution waveform convolution processing for the path. Specifically, the timing verification device 11 adds wiring delay to the result of synthesis of distribution wavelengths in the delays at the gates (cell delays) to obtain the distribution waveform of the delay at the input terminal (end point) of the cell that is to be checked.

In step 45, the timing verification device 11 re-computes End_Arrival_Time and Start_Arrival_Time. The difference between End_Arrival_Time and Start_Arrival_Time is the pulse width, and the difference between the pulse width and a predetermined timing (i.e., an allowable pulse width of the cell) defines a slack value (a slack for the timing). The timing verification device 11 computes a time point that is retarded by 3σ of an amount of rise or fall variation with respect to the distribution waveform of Start_Arrival_Time, and computes a time point that is advanced by 3σ of an amount of rise or fall variation with respect to the distribution waveform of "End_Arrival_Time". When the amount of variation in voltage and temperature are to be taken into account, the timing verification device 11 multiplies the amount of variation to the distribution waveform of End_Arrival_Time under the worst conditions, and multiplies the amount of variations to the distribution waveform of Start_Arrival_Time under the best conditions.

In step 46, the timing verification device 11 computes the slack value (the slack for the timing) of the path that is to be checked based on the computation result in step 45. The timing verification device 11 then determines whether or not the timing conforms to the timing conditions (whether or not the timing satisfies the predetermined timing conditions) based on the computed slack value.

As described above, the timing verification device 11 handles the amount of rise variation and the amount of fall variation separately to perform the timing verification while taking into account the correlation between these amounts of variation. This makes it possible to perform the timing verification while correctly taking variation into account and to perform an effective verification.

The variation correction coefficients extracted in step 24 (see FIG. 4) are values obtained by taking into account the correlation between rise and fall. This enables timing verification to be performed with the correlation between rise and fall being taken into account by adjusting the amount of variation at either End_Arrival_Time or Start_Arrival_Time (e.g., at End_Arrival_Time).

FIG. 7 shows the amounts of variation in the same path as that handled in step 43 of FIG. 6.

FIG. 7 shows the amounts of variation set for the respective factors consisting of transistor process variations, power supply voltage, temperature, wiring, and computing error for the case of H pulses, in terms of the worst conditions and the best conditions of PTV (process, temperature, voltage). In the representation of amounts of variation in the column of wiring shown in FIG. 7, "Xtalk" indicates crosstalk between wirings and shows that the amount of variation in wiring includes an amount of variation caused by crosstalk "Xtalk". In the representation of amounts of variation in the columns of "temperature" and "power supply voltage", "wt", "bt", "wv", and "bv" are set as delay correction coefficients.

Figure 8:
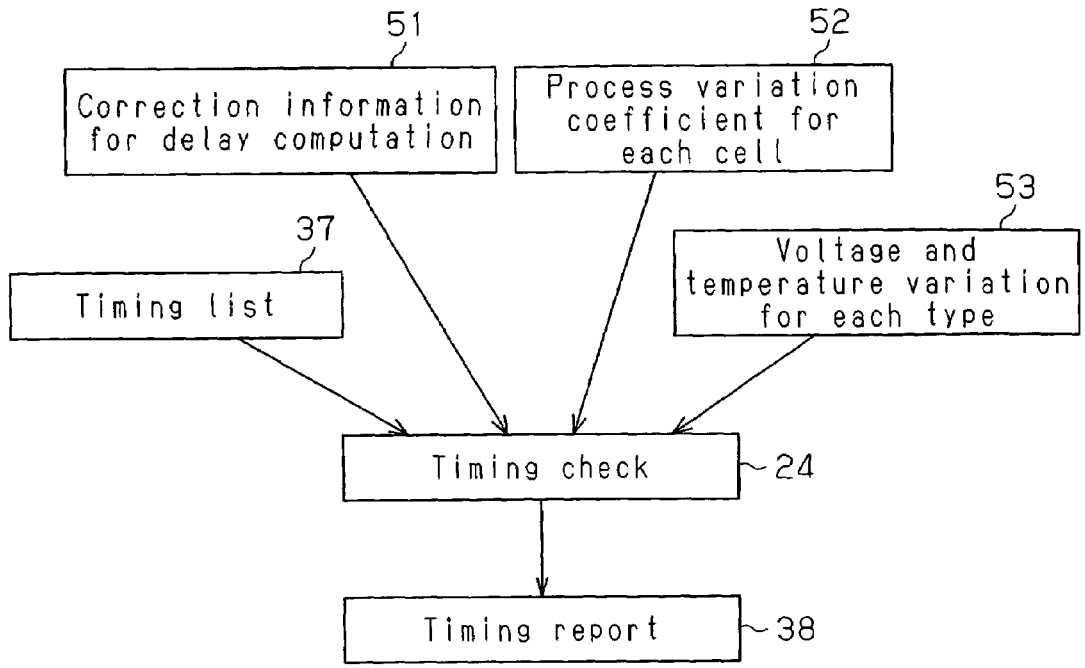
FIG. 8 is a diagram showing input/output data during the timing check performed by the timing verification device of FIG. 5.

FIG. 8 shows the data input and output during the timing check (step 24) of FIG. 4. Specifically, in step 24, the timing verification device 11 retrieves correction information 51 (coefficients of on-chip variation) for the delay computation results that is set in the timing list 37 and the setup file 33, coefficients of variation for each cell for the process conditions (Kocv_p) 52, and delay correction coefficients for the voltage conditions and temperature conditions for each type of cells (Kocv_v, Kocv_t) 53, and generates the timing report 38.

The extraction for the coefficients of variation, amounts of variation, and variation correction coefficients will now be described in detail.

The extraction procedures for the coefficients of variation will first be described.

1. A "rise" delay value and a "fall" delay value in the typical process are measured and the measured values are set as Tpd_typ_rise and Tpd_typ_fall, respectively.

2. A rise delay value and a fall delay value are measured after changing the process conditions and the measured values are set as Tpd_xx_rise and Tpd_xx_fall, respectively. The process conditions include a combination of Pch and Nch. Delay evaluation results may exhibit combinations of the rise delay and the fall delay as combinations of slow and slow, slow and fast, fast and slow, and fast and fast. These results are represented by ss, sf, fs, and ff, respectively. For example, if the combination the rise delay and the fall delay is slow and slow, the measured value is represented as Tpd_ss_rise, Tpd_ss_fall.

3. Delay variation in delay values under the changed process conditions relative to the delay values in the typical process is computed as a ratio of the delay value in the changed process conditions relative to the delay value in the typical process. The ratios of the delay variation of the rise delay value and the fall delay value are respectively represented as:

ratio_rise=(*Tpd_xx*_rise)/(*Tpd_typ*_rise)

ratio_fall=(*Tpd_xx*_fall)/(*Tpd_typ*_fall)

These ratios are set as the coefficients of variation.

Figure 9:
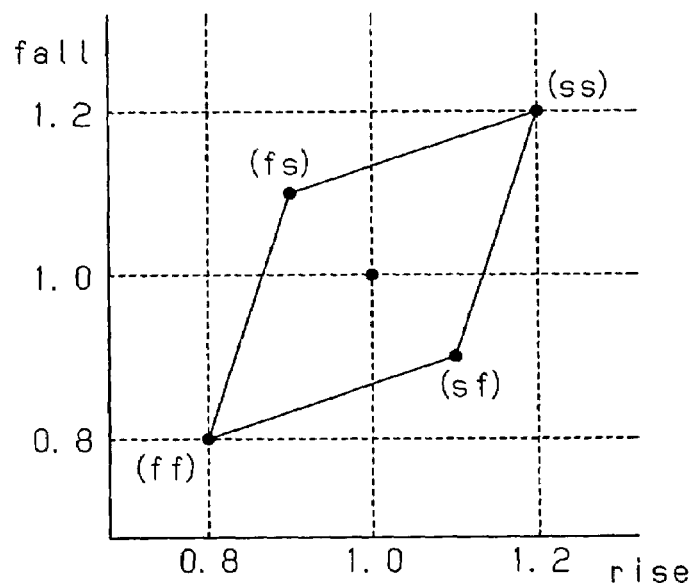
FIG. 9 is a characteristic diagram showing the range of signal variation.
Figures 10, 11:
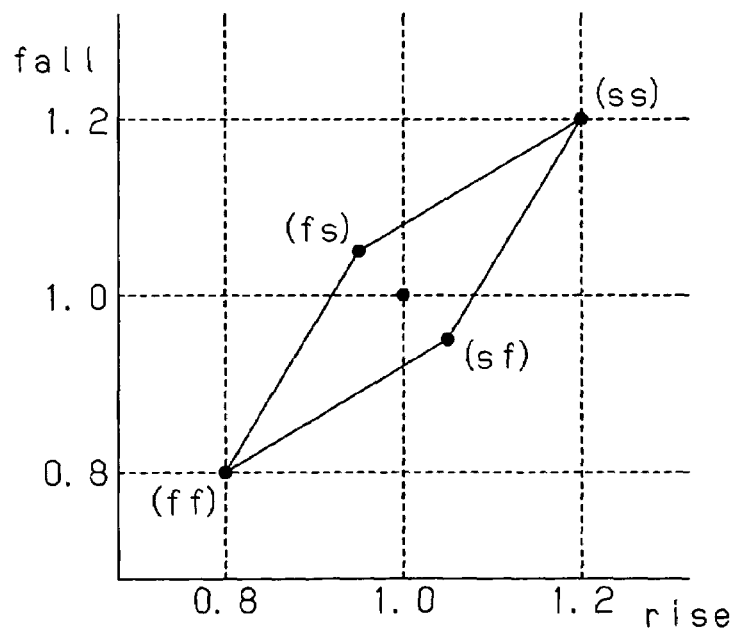
FIG. 10 is a table showing variation in signals.
FIG. 11 is a characteristics diagram showing the range of signal variation.
Figure 12A:
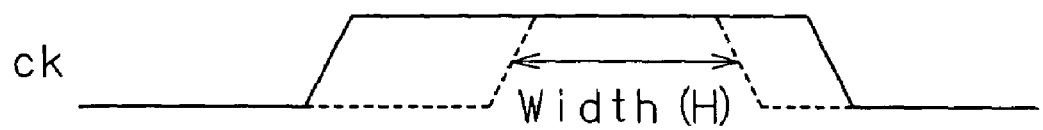
FIGS. 12A to 12D are waveform diagrams showing signal variation conditions.
Figure 12B:
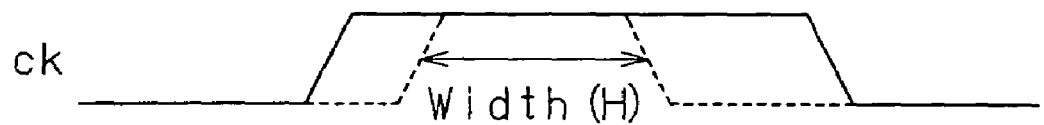
Figure 12C:
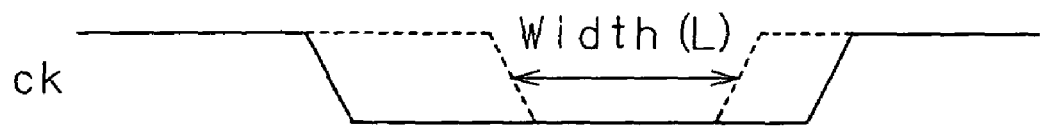
Figure 12D:
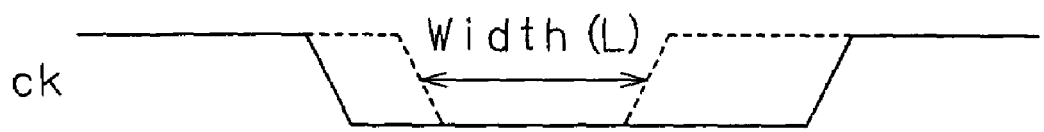

4. The ratios in the four different combinations between the "rise" delay and "fall" delay are tabulated into a table 61. FIG. 10 shows an example of the table 61, and FIG. 9 is a graph corresponding to the table 61. The table shown in FIG. 10 and the graph shown in FIG. 9 relate to an example of characteristics of an inverter circuit (inverting buffer), and the values in the parenthesis in the table indicates values of "rise_ratio: fall_ratio". In the graph, the "rise" delay value and the "fall" delay value at the center of variation (typical process) are indicated by "1". In FIG. 9, the range defined by the solid lines represents the range of variation.

The procedures for extracting the amounts of variation will now be described.

The amounts of variation are extracted from the variation coefficient table 61 generated as described above, while taking into account verification conditions of the timing verification.

The verification conditions include corner conditions (worst and best) and types of pulses (H and L). A coefficient of variation is extracted while taking into account the variation conditions in which the pulse width becomes small (see FIGS. 12A to 12D), and an absolute value of the difference between the center of variation and the extracted coefficient of variation is set as an amount of variation. Specifically, referring to FIG. 9, a relative coordinate value of the vertices of the quadrangle indicating the range of variation with respect to the center of variation is extracted as the amount of variation. Since the value of the center is "1", the amount of variation is set to an absolute value of (1−ratio).

In the case of an H pulse under the worst conditions (refer to FIG. 12A), the pulse width is decreased under the condition where rise is slow while fall is fast. The coefficient of variation for rise and the coefficient of variation for fall are never increased simultaneously in the same cell. Therefore, the extraction of the amount of variation is performed by considering the values at the adjacent corners of the quadrangle in FIG. 9, (ss) and (sf), instead of the values at the opposite angle thereof, (ss) and (ff). Accordingly, the absolute value "0.2" of the difference between the median value and the coordinate value (rise component) of the point (ss) that defines the maximum value of the coefficients of rise variation is set as the amount of rise variation under the worst conditions. Similarly, the absolute value of "0.1" of the difference between the median value and the coordinate value ("fall" component) at the point (sf) that defines the minimum value of the coefficients of "fall" variation is set as the amount of "fall" variation under the worst conditions.

In a similar manner, the amount of variation for an L pulse under the worst conditions, an amount of variation for an H pulse under the best conditions, and an amount of variation for an L pulse under the best conditions are extracted. The extraction results may be summarized as follows.

rise=0.2 (ss), and fall=0.1 (sf) for the H pulse under the worst conditions;

fall=0.2 (ss) and rise=0.1 (fs) for the L pulse under the worst conditions;

rise=0.1 (sf) and fall=0.2 (ff) for the H pulse under the best conditions; and fall=0.1 (fs) and rise=0.2 (ff) for the L pulse under the best conditions.

FIG. 11 is a graph showing an example of the range of variation in a buffer circuit (non-inverting buffer). Based on this range of variation, amounts of variation are set as follows in the same manner as in the case of the inverter circuit described above.

rise=0.2 (ss) and fall=0.05 (sf) for the H pulse under the worst conditions fall=0.2 (ss) and rise=0.05 (fs) for the L pulse under the worst conditions rise=0.05 (sf) and fall=0.2 (ff) for the H pulse under the best conditions fall=0.05 (fs) and rise=0.2 (ff) for the L pulse under the best conditions The procedures for extracting the variation correction coefficients will now be described.

The ratio of the amount of fall variation or the amount of rise variation to the maximum value of variation is set as a variation correction coefficient (Kd_c) in the respective conditions. This correction coefficient indicates the correlation between the rise delay value and the fall delay value. For example, for an H pulse, the ratio of the amount of fall variation to the maximum value is set as the correction coefficient under the worst conditions so that the delay is accelerated by the variation, and the ratio of the amount of rise variation to the maximum value is set as the correction coefficient under the best conditions so that the delay is retarded by the variation. On the other hand, for an L pulse, the ratio of the amount of rise variation to the maximum value is set as the correction coefficient under the worst conditions so that the delay is retarded by the variation, and the ratio of the amount of fall variation to the maximum value is set as the correction coefficient under the best conditions so that the delay is accelerated by the variation.

In the case of an inverter circuit having the characteristics as shown in FIG. 9, the amounts of rise and fall variation are as follows.

rise=0.2 (ss) and fall=0.1 (sf) for the H pulse under the worst conditions fall=0.2 (ss) and rise=0.1 (fs) for the L pulse under the worst conditions rise=0.1 (sf) and fall=0.2 (ff) for the H pulse under the best conditions fall=0.1 (fs) and rise=0.2 (ff) for the L pulse under the best conditions Since the maximum value is 0.2, the correction coefficient Kd_c is set as described below in the respective conditions.

Kd_c(fall)=0.1/0.2=0.5 for the H pulse under the worst conditions

Kd_c(rise)=0.1/0.2=0.5 for the L pulse under the worst conditions

Kd_c(rise)=0.1/0.2=0.5 for the H pulse under the best conditions

Kd_c(fall)=0.1/0.2=0.5 for the L pulse under the best conditions

Similarly, when a buffer circuit has the characteristics shown in FIG. 11, the correction coefficient Kd_c is set as described below in the respective conditions.

Kd_c(fall)=0.05/0.2=0.25 for the H pulse under the worst conditions

Kd_c(rise)=0.05/0.2=0.25 for the L pulse under the worst conditions

Kd_c(rise)=0.05/0.2=0.25 for the H pulse under the best conditions

Kd_c(fall)=0.05/0.2=0.25 for the L pulse under the best conditions

Although the description of the embodiment above has been made in terms of the method for extracting the coefficients of variation, amounts of variation, correction coefficients on the basis of the typical process, the center characteristics of a chip may be used as the basis for representing the on-chip variation.

The timing verification method will now be described.

Figure 13:
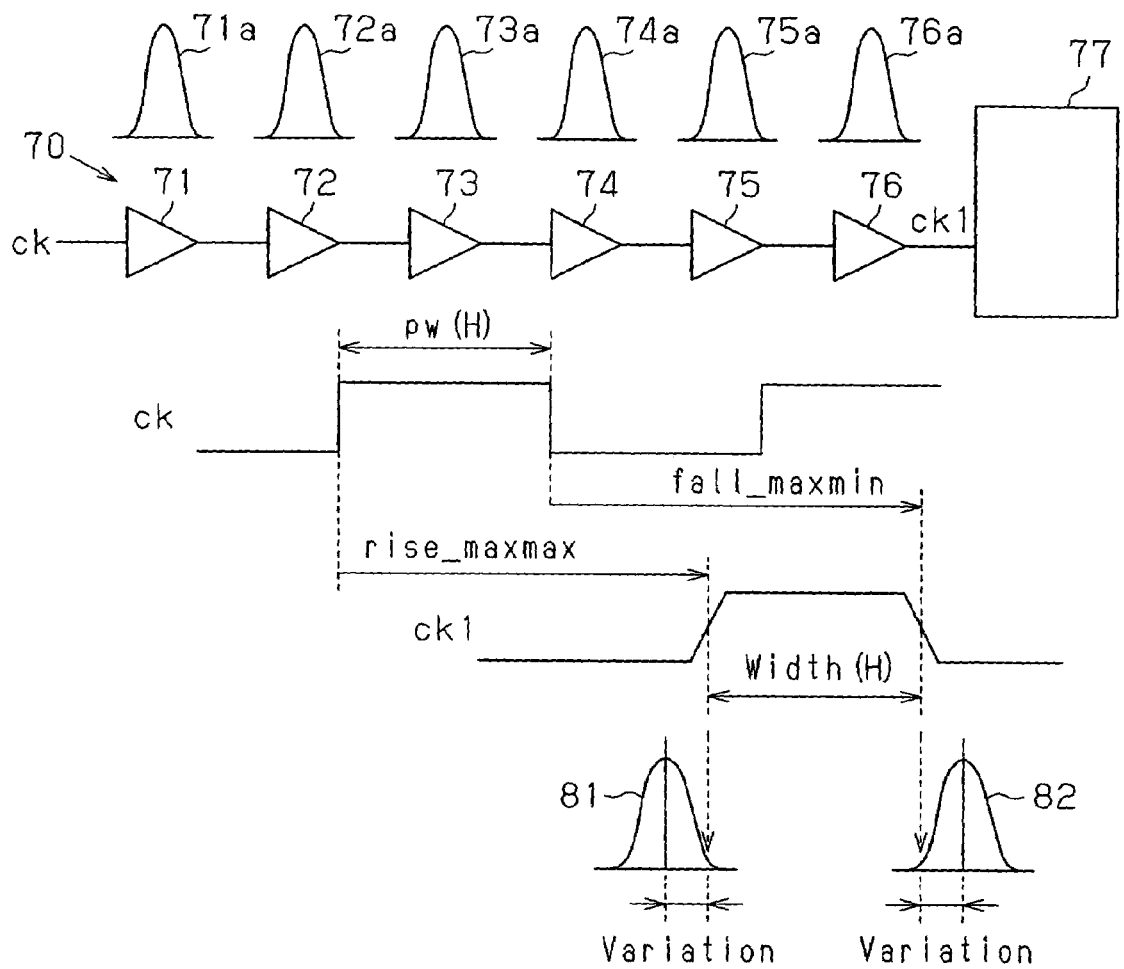
FIG. 13 is a schematic diagram showing the pulse width check performed by the timing verification device of FIG. 5.

FIG. 13 is a schematic diagram showing a pulse width check performed in the static timing analysis.

A clock ck is provided to a clock input terminal of a flipflop circuit (FF circuit) 77 via a plurality of buffer circuits 71 to 76. FIG. 13 shows distributions of variation 71a to 76a in the buffer circuits 71 to 76. The timing verification device 11 shown in FIG. 5 verifies the pulse width of the clock ck1 at the clock input terminal of the FF circuit 77 while taking into account the delay variation in the path 70 transferring the clock ck to FF circuit 77.

The timing verification device 11 estimates delay distributions of variation 71a to 76a in the buffer circuits 71 to 76 on the basis of the amounts of variation previously extracted and the delay information analyzed from the cell library 34 (see FIG. 4) and the wiring parasitic capacitance in the parasitic information file 32 for the cells (the buffer circuits 71 to 76) in the path 70. Subsequently, the timing verification device 11 causes the estimated distribution information to be propagated to the clock input terminal of the FF circuit 77. After the propagation, the timing verification device 11 computes delay times fall_maxmin and rise_maxmax while taking into account 3σ of a rise variation distribution 81 and 3σ of a fall variation distribution 82 at the clock input terminal of the FF circuit 77. Based on these delay times and the pulse width pw(H) of the clock ck, the timing verification device 11 obtains the pulse width Width(H) of the clock ck1 with the equation shown below.

Width(H)=pw(H)+fall_maxmin−rise_maxmax

The timing verification device 11 then compares the obtained pulse width Width(H) with a specified value tPW(H) for the FF circuit 77 to check the pulse width.

The description above will now be made based on the terms used in the timing list 37 (see FIG. 4). The pulse width "Actual Pulse Width" at the input terminal of the FF circuit 77 that is to be checked is obtained by the following equation based on the arrival time of the first edge of the pulse Start Arrival Time and the arrival time of the last edge of the pulse End Arrival Time.

Actual Pulse Width=End Arrival Time−Start Arrival Time

The arrival time Start Arrival Time and End Arrival Time are obtained by taking 3σ of the distribution of variation into account.

Using the pulse width Actual Pulse Width and the operation time required by the FF circuit 77 Required Time (specified values Cell Spec PWIDTH_H and Cell Spec PWIDTH_L), the slack value for the FF circuit 77 is obtained from the following equation.

Slack=Actual Pulse Width−Required Time

The timing verification device 11 determines that the timing is satisfied (OK) if the obtained slack value is equal to or greater than zero and determines that the timing is not satisfied (NG) if the slack value is less than zero.

Figure 14:
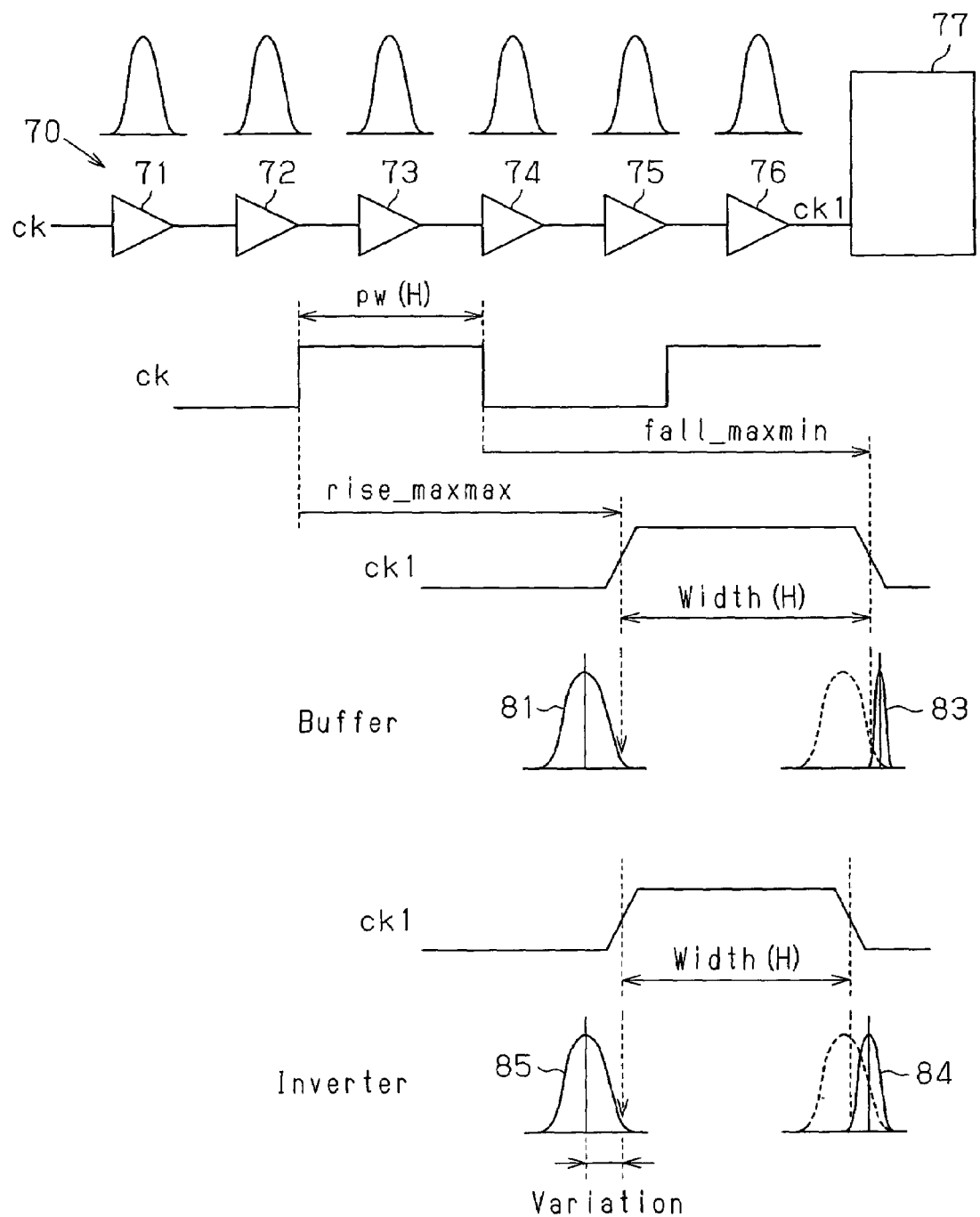
FIG. 14 is a schematic diagram showing the pulse width check.

FIG. 14 is a schematic diagram showing a pulse width check performed in another static timing analysis.

A path 70 has the same configuration as the path in FIG. 13. The timing verification device 11 performs the pulse check using a variation correction coefficient Kd_c.

Specifically, the timing verification device 11 multiplies the distribution of variation at the input terminal of an FF circuit 77, which is the cell that is checked, by the correction coefficient to obtain a correction distribution 83. The timing verification device 11 then computes delay times fall_maxmin and rise_maxmax based on 3σ of the obtained fall correction distribution 83 and the distribution of a rise variation 81. The timing verification device 11 computes a pulse width Width(H) of the clock ck1 based on the delay times fall_maxmin and rise_maxmax and the pulse width pw(H) of the clock ck to check the pulse width. The correction distribution 83 described above is for a buffer. The timing verification device 11 computes a correction distribution 84 in the same manner also for an inverter and checks the pulse width based on the correction distribution 84 and the rise variation distribution 85.

Figure 15:
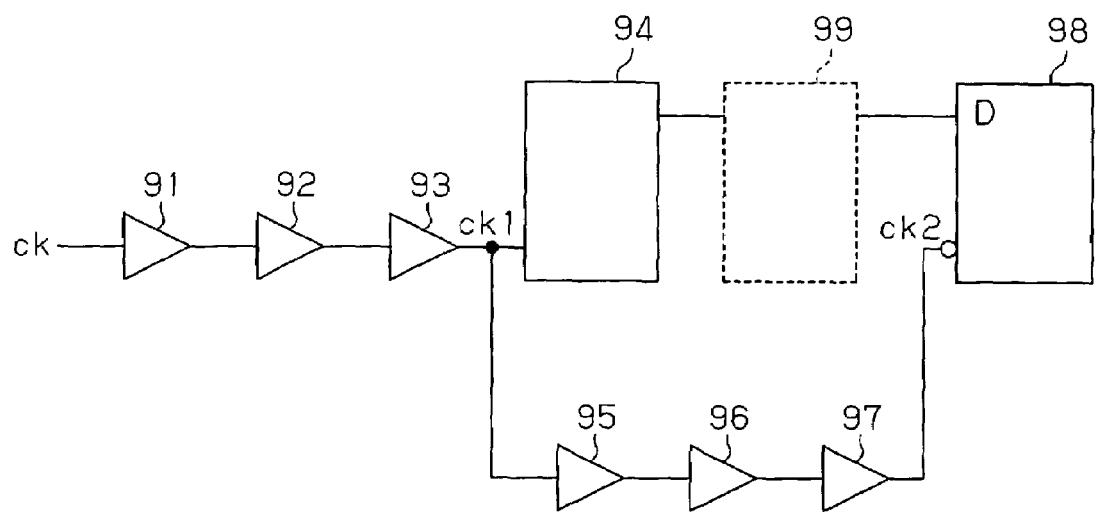
FIG. 15 is a schematic diagram showing the timing check performed by the timing verification device of FIG. 5.
Figure 15:
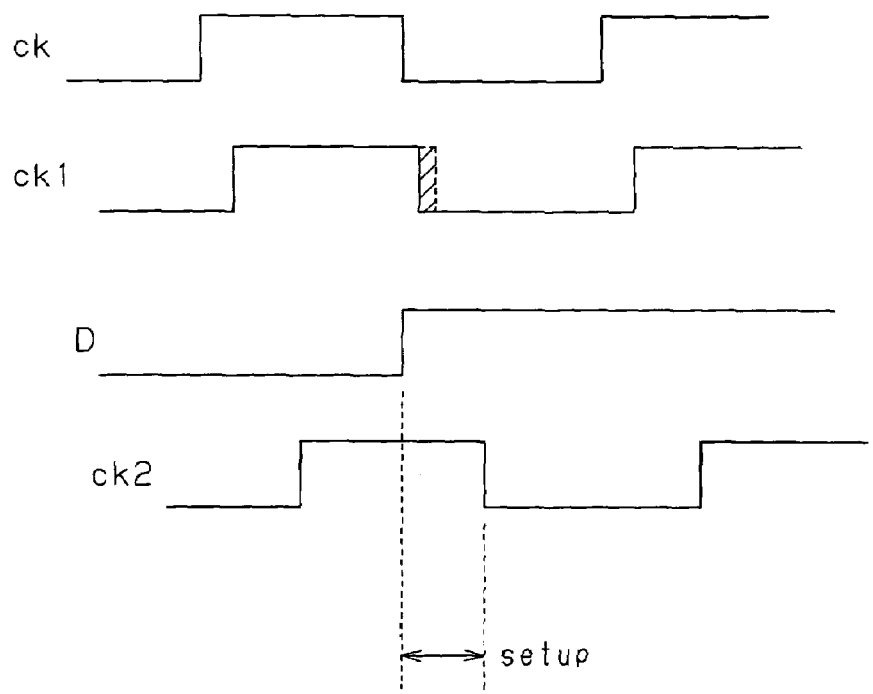

FIG. 15 is a schematic diagram showing a method for verifying the timing of the setup time in the static timing analysis.

A clock ck is provided to a clock input terminal of a first FF circuit 94 as a clock ck1 through buffer circuits 91 to 93. The clock ck1 is provided to an inverting clock input terminal of a second FF circuit 98 as a clock ck2 via buffer circuits 95 to 97. The first FF circuit 94 outputs a data signal from its data output terminal in synchronization with the rising edge of the clock ck1. The data signal is provided as a data signal to a data input terminal D of the second FF circuit 98 through a combination circuit 99. The second FF circuit 98 operates in synchronization with the falling edge of the clock ck2 to output a data signal having a level corresponding to the signal level at the data input terminal D.

In the timing verification device 11, as shown in FIG. 15, the correction coefficient is applied to the falling edge of the first clock ck1 that is transferred to the common path between the first FF circuit 94 and the second FF circuit 98. The application of the correction coefficient to the falling edge of the first clock ck1 moderates or decreases the amount of variation in the second clock signal ck2. In the STA analysis processing shown in FIG. 4, the timing verification device 11 handles the variation by a command such as set timing derate, while taking the correction coefficient into account. For example, when a coefficient Kd is set for set timing derate, a coefficient (1−(1−Kd)×Kd_c) is computed by taking the correction coefficient into account, and the use of the coefficient thus computed moderates or decreases the amount of variation of the second clock ck2.

The timing verification device 11 of the preferred embodiment has the advantages described below.

(1) Distributions of variation 71a to 76a are obtained in correspondence with the rising and falling edges of respective signals at the buffer circuits 71 to 76 forming the path 70 serving as the propagation path of the clock ck. The distributions of variation 71a to 76a are propagated along the path 70 to the input terminal of the FF circuit 77. The timing verification at the input terminal is performed based on the rise variation distribution 81 and the fall variation distribution 82. Accordingly, the rise delay time and the fall delay time (i.e., the rise variation and the fall variation) are considered separately to enable accurate verification. Thus, effective verification can be performed, and the design period can be shortened. The accuracy of timing verification is enhanced and thus the quality of timing verification is improved.

(2) The variations corresponding to the rising and falling edges of the clock ck are digitized under the conditions in which the pulse width of the signal that is to be verified becomes smaller. The pulse width at the input terminal is checked based on the digitized amounts of variation. Accordingly, the pulse width at the input terminal is accurately verified.

(3) A correction coefficient representing the correlation between rise and fall is obtained by computing the ratio of the amount of variation to the maximum value based on the amounts of the rise variation and the amount of fall variation. The pulse width is then computed based on the correction coefficient thus obtained. Accordingly, even when the coefficients of variation cannot be handled separately like for the FF circuits 94 and 98 operating in the opposite phases of the clock ck, the verification is possible while taking into account the rise variation and the fall variation.

It should be apparent to those skilled in the art that the present invention may be embodied in many other specific forms without departing from the spirit or scope of the invention. Particularly, it should be understood that the present invention may be embodied in the following forms.

Figure 16:
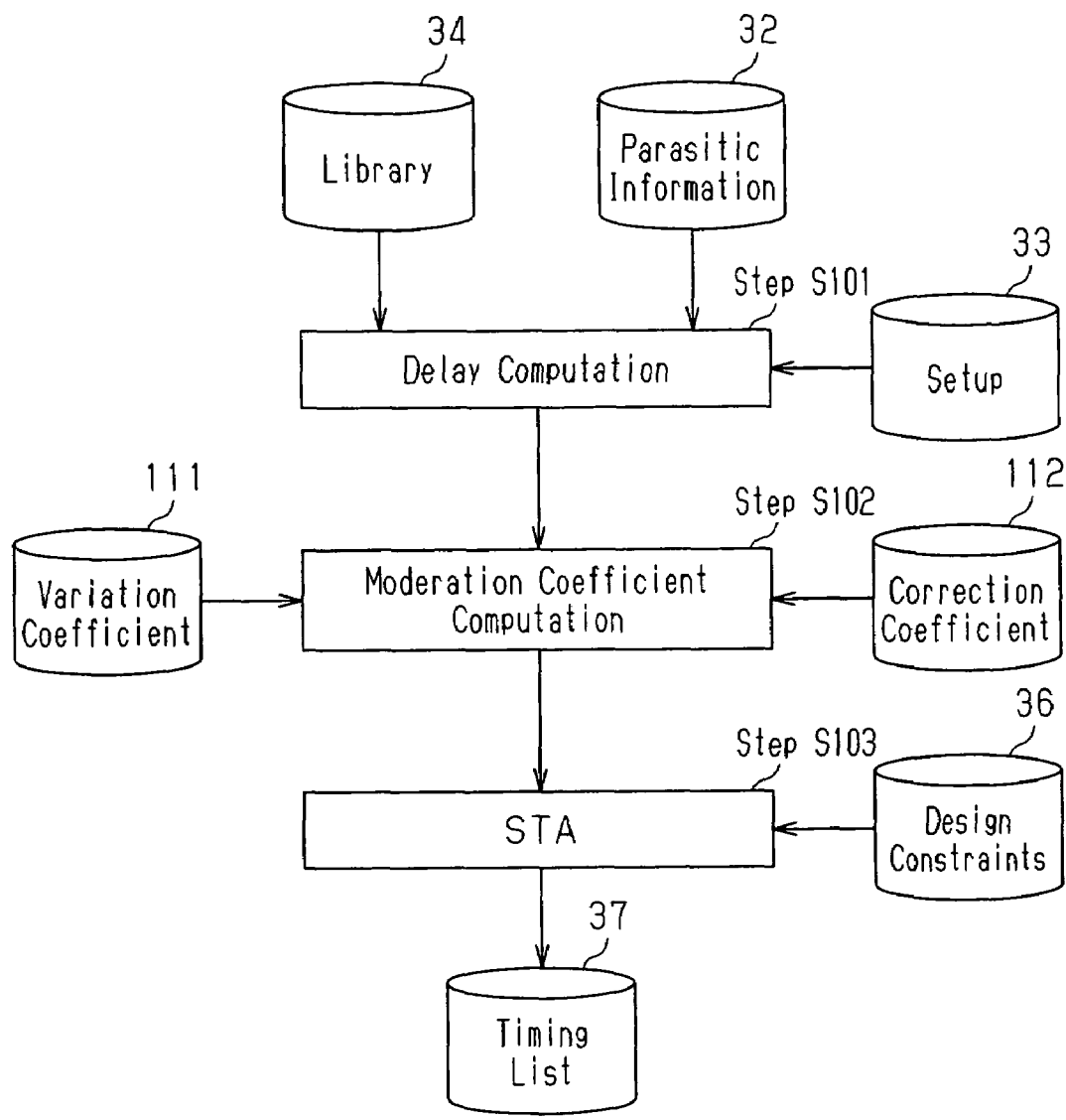
FIG. 16 is a flowchart showing first further timing verification processing.

In the preferred embodiment, the timing check is performed while taking into account the amounts of variation and the variation correction coefficients (step 24 in FIG. 4) after the execution of the STA (step 23 in FIG. 4). However, this procedure may be modified when necessary. For example, as shown in FIG. 16, a step for computing the moderation coefficient to reduce the variation based on the correction coefficient (step 102) may be performed after the delay computation step (step 101) and before the STA (step 103). In this computation step, the timing verification device 11 retrieves a coefficient of variation from a file 111 and a variation correction coefficient from a file 112, and performs the analysis by applying the coefficient of variation and the variation correction coefficient to the pulse check or to the opposite phase clocks.

Figure 17:
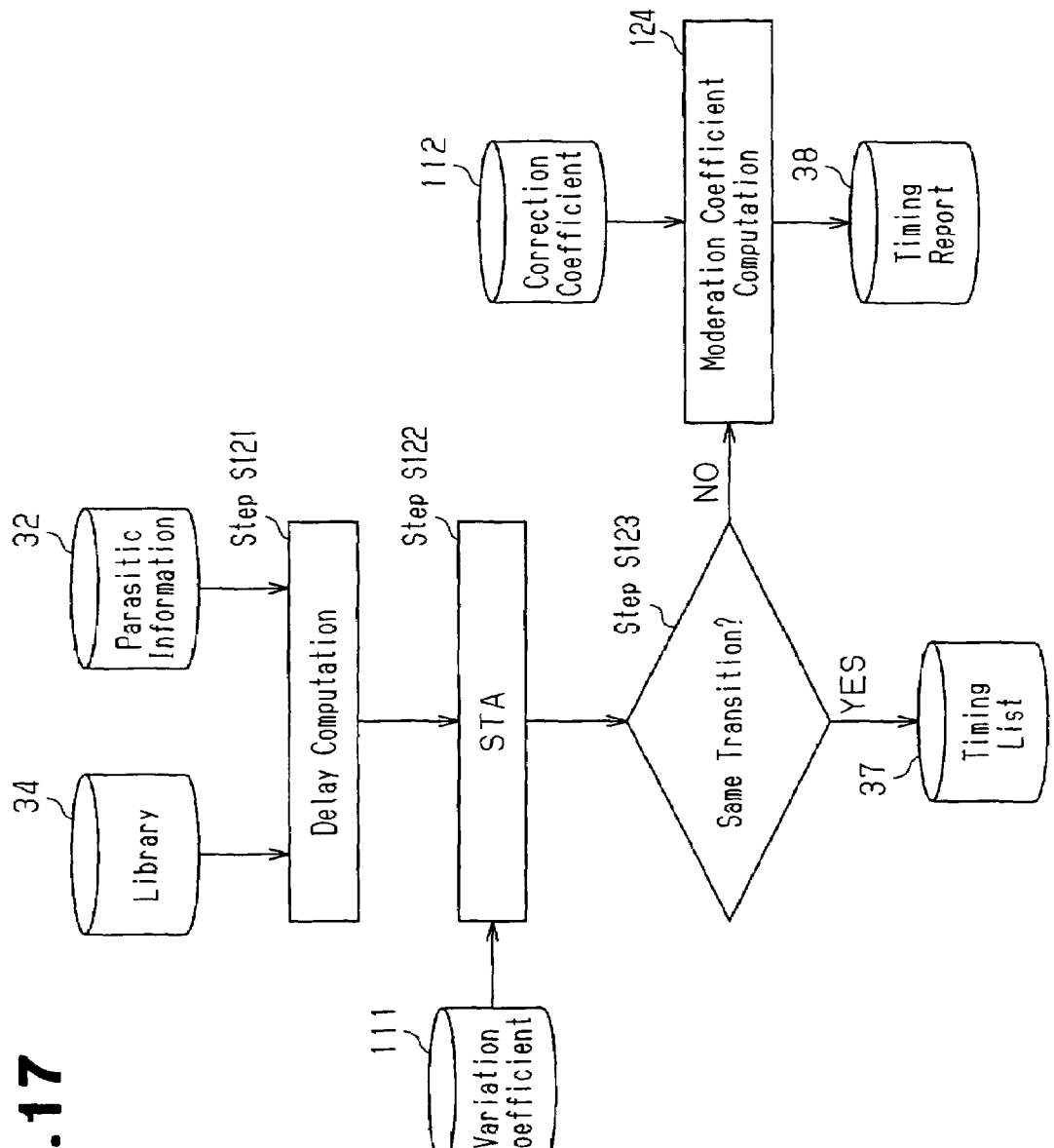
FIG. 17 is a flowchart illustrating second further timing verification processing.

Further, as shown in FIG. 17, the timing verification device 11 may determine whether or not the clock transitions at two input terminals that are to be checked are the same (step 123) after executing the delay computation (step 121) and the STA (step 122). If the signal transitions are the same at the two terminals (YES in step 123), a timing list 37 is generated on the result of step 122. If the signal transitions are not the same (NO in step 123), the moderation coefficient is computed on the basis of the correction coefficients in the file 112 (step 124) to generate a timing report 38.

It is also possible to identify rise and fall for each type of cells during STA (e.g., in step 122 of FIG. 17) to apply the amount of variation and the variation correction coefficient.

The present examples and embodiments are to be considered as illustrative and not restrictive, and the invention is not to be limited to the details given herein, but may be modified within the scope and equivalence of the appended claims.

What is claimed is:

1. A method for verifying timing of a signal provided to an input terminal through a path including one or more instances with a computer, the method comprising:

generating a distribution of variations in the rise of the signal and a distribution of variations in the fall of the signal at each of the instances;

propagating the distribution of variations in the rise of the signal and the distribution of variations in the fall of the signal to the input terminal along the path;

computing a pulse width of the signal at the input terminal based on the distribution of variations in the rise of the signal and the distribution of variations in the fall of the signal propagated to the input terminal; and verifying a timing of the signal at the input terminal based on the computed pulse width.

2. The method according to claim 1, wherein:

said generating a distribution of variations in the rise of the signal and a distribution of variations in the fall of the signal includes computing an amount of variation in the rise of the signal and an amount of variation in the fall of the signal under conditions in which the pulse width of the signal becomes small; and said computing includes computing the pulse width of the signal at the input terminal based on the amount of variation in the rise of the signal and the amount of variation in the fall of the signal.

3. The method according to claim 2, wherein said computing includes:

computing a correction coefficient representing the correlation between the rise and the fall of the signal based on the amount of variation in the rise of the signal and the amount of variation in the fall of the signal; and computing the pulse width by using the correction coefficient.

4. The method according to claim 3, wherein the correction coefficient is a ratio of one of the amount of variation in the rise of the signal and the amount of variation in the fall of the signal to a maximum value of the amounts of variation.

5. The method according to claim 2, further comprising performing a static timing analysis on the path to generate delay information, wherein:

said generating a distribution of variation in the rise of the signal and a distribution of variations in the fall of the signal includes generating the distribution of variations in the rise of the signal and the distribution of variations in the fall of the signal by using the delay information, the amount of variation in the rise of the signal, and the amount of variation in the fall of the signal.

6. The method according to claim 5, wherein said generating a distribution of variations in the rise of the signal and a distribution of variations in the fall of the signal includes:

computing a first ratio of a delay value at the rise of the signal under a predetermined condition as a first coefficient of variation to a delay value in a typical process, and computing a second ratio of a delay value at the fall of the signal under a predetermined condition as a second coefficient of variation to the delay value in the typical process;

generating a table having plural sets of first and second coefficients of variation corresponding to a plurality of conditions; and computing the amount of variation in the rise of the signal and the amount of variation in the fall of the signal corresponding to a predetermined verification condition based on some of the plural sets of first and second coefficients of variation in the table.

7. The method according to claim 1, wherein the instances includes:

a first plurality of instances for providing a first signal to a first input terminal of a first circuit; and a second plurality of instances for receiving the first signal and providing a second signal to a second input terminal of a second circuit, in which the first and second signals have opposite phases, the first circuit generates an output signal in response to the first signal, and the second circuit receives the output signal at a third input terminal as a third signal; and said generating a distribution of variations in the rise of a signal and a distribution of variations in the fall of the signal includes:

computing an amount of variation in the rise and an amount of variation in the fall of each of the first to third signals; and moderating either one of the amount of variation of the first signal and the amount of variation of the second signal by applying a moderation coefficient and computing a moderated amount of variation of the moderated second signal; and said computing includes:

computing pulse widths of the second and third signals based on the moderated amount of variation of the second signal and the amount of variation of the third signal.

8. The method according to claim 1, wherein:

said generating a distribution of variations in the rise of the signal and a distribution of variations in the fall of the signal includes generating the distribution of variations in the rise of the signal and the distribution of variations in the fall of the signal for each type of the instances.

9. A device for verifying timing of a signal provided to an input terminal through a path including one or more instances, the device comprising:

a signal propagation unit for generating a distribution of variations in the rise of the signal and a distribution of variations in the fall of the signal in each of the instances to propagate the distribution of variations in the rise and the distribution of variations in the fall of the signal to the input terminal along the path; and a verification unit for computing a pulse width of the signal at the input terminal based on the distribution of variations in the rise and the distribution of variations in the fall of the signal propagated to the input terminal, and for verifying a timing of the signal at the input terminal based on the computed pulse width.

10. The device according to claim 9, further comprising:

a computation unit for computing the amount of variation in the rise of the signal and an amount of variation in the fall of the signal under conditions in which the pulse width of the signal becomes small, wherein the verification unit computes the pulse width of the signal at the input terminal based on the amount of variation in the rise of the signal and the amount of variation in the fall of the signal.

11. The device according to claim 9, wherein the instances include a first plurality of instances for providing a first signal to a first input terminal of a first circuit and a second plurality of instances for receiving the first signal and providing a second signal to a second input terminal of a second circuit, in which the first signal and the second signal have opposite phases, the first circuit generates an output signal in response to the first signal, and the second circuit receives the output signal at a third input terminal as a third signal, the device further comprising:

a computation unit for computing an amount of variation in the rise and an amount of variation in the fall of each of the first to third signals and for moderating either one of the amount of variation of the first signal and the amount of variation of the second signal by applying a moderation coefficient to compute a moderated amount of variation of the moderated second signal, wherein the verification unit checks the timings of the second and third signals based on the moderated amount of variation of the second signal and the amount of variation of the third signal.

12. The device according to claim 9, wherein the signal propagation unit generates the distribution of variations in the rise of the signal and the distribution of variations in the fall of the signal for each type of the instances.

* * * * *